United States Patent
Bhattacharyya et al.

(10) Patent No.: US 10,557,724 B1
(45) Date of Patent: Feb. 11, 2020

(54) ANGLE DETECTION OF A ROTATING SYSTEM USING A SINGLE MAGNET AND MULTIPLE HALL SENSORS

(71) Applicant: Apple Inc., Cupertino, CA (US)

(72) Inventors: Manoj K. Bhattacharyya, Cupertino, CA (US); Daniel Ray Bloom, Alameda, CA (US); Rajesh Anantharaman, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/145,941

(22) Filed: Sep. 28, 2018

(51) Int. Cl.
  *G01D 5/14* (2006.01)
  *G06F 3/01* (2006.01)
  *G01R 33/038* (2006.01)
  *G01R 33/09* (2006.01)

(52) U.S. Cl.
  CPC ........... *G01D 5/145* (2013.01); *G01R 33/038* (2013.01); *G01R 33/093* (2013.01); *G01R 33/096* (2013.01); *G01R 33/098* (2013.01); *G06F 3/011* (2013.01)

(58) Field of Classification Search
  CPC .... G01D 5/145; G01R 33/038; G01R 33/098; G01R 33/096; G01R 33/093; G06F 3/011
  USPC ............. 324/207.11–207.23, 207.25–207.26, 324/166–167, 174
  See application file for complete search history.

(56) References Cited

U.S. PATENT DOCUMENTS

| | | |
|---|---|---|
| 4,283,679 A | 8/1981 | Ito et al. |
| 5,483,261 A | 1/1996 | Yasutake |
| 5,488,204 A | 1/1996 | Mead et al. |
| 5,526,429 A | 6/1996 | Inanaga et al. |
| 5,825,352 A | 10/1998 | Bisset et al. |
| 5,835,079 A | 11/1998 | Shieh |
| 5,844,816 A | 12/1998 | Inanaga et al. |
| 5,880,411 A | 3/1999 | Gillespie et al. |

(Continued)

FOREIGN PATENT DOCUMENTS

| | | |
|---|---|---|
| CN | 104023105 A | 9/2014 |
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Giovanni Astacio-Oquendo
(74) *Attorney, Agent, or Firm* — Kubota & Basol LLP

(57) ABSTRACT

An angular detection system including a magnet and sensors is disclosed. The magnet can be located on a rotating component and the sensors can be located on a stationary component, or vice versa. The magnet can generate a plurality of magnetic flux lines. The plurality of sensors can be located and spatially separated along the motion path of the magnet for detecting the magnetic flux densities. The strength of the magnetic flux lines sensed by a given sensor can be used to determine the location of the magnet along its motion path. The plurality of sensors can generate one or more signals indicative of the strength of the sensed magnetic field lines. Based on the strength of the magnetic flux lines, the location of the magnet, or both, the system can determine the angle of rotation of the device by using a polynomial function or a look-up table.

20 Claims, 11 Drawing Sheets

(56) References Cited

U.S. PATENT DOCUMENTS

| | | |
|---|---|---|
| 6,188,391 B1 | 2/2001 | Seely et al. |
| 6,310,610 B1 | 10/2001 | Beaton et al. |
| 6,323,846 B1 | 11/2001 | Westerman et al. |
| 6,690,387 B2 | 2/2004 | Zimmerman et al. |
| 7,015,894 B2 | 3/2006 | Morohoshi |
| 7,184,064 B2 | 2/2007 | Zimmerman et al. |
| 7,663,607 B2 | 2/2010 | Hotelling et al. |
| 8,479,122 B2 | 7/2013 | Hotelling et al. |
| 9,565,490 B2 | 2/2017 | Hyatt |
| 9,742,456 B2 | 8/2017 | Park et al. |
| 2006/0197753 A1 | 9/2006 | Hotelling |
| 2008/0303138 A1* | 12/2008 | Flett .............. H01L 23/473 257/714 |
| 2011/0074406 A1* | 3/2011 | Mather .............. B82Y 25/00 324/252 |
| 2012/0038351 A1* | 2/2012 | Saruki .............. G01R 33/091 324/207.25 |
| 2016/0231528 A1 | 8/2016 | Wong et al. |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

ANGLE DETECTION OF A ROTATING SYSTEM USING A SINGLE MAGNET AND MULTIPLE HALL SENSORS

FIELD OF THE DISCLOSURE

This disclosure relates to a system for detecting the angle of rotation using magnetic sensing.

BACKGROUND OF THE DISCLOSURE

Virtual reality (VR) technology can be used for many applications such as military training, educational learning, and video games. VR technology can use one or more electronic devices to simulate a virtual environment and the user's physical presence in that virtual environment. One type of VR technology is augmented reality (AR) technology, where the user's real environment can be supplemented with computer-generated objects or content. Another type of VR technology is mixed reality (MR) technology, where the user's real environment and the virtual environment can be blended together.

VR/AR/MR technology can be simulated using one or more electronic devices. One electronic device can be a VR headset, where the user can use the VR headset to see the simulated virtual environment. As the user moves his or her head to look around, a display included in the headset can update to reflect the user's head movement. The VR headset can be worn on the user's head while the user is interacting with the VR system and can be removed from the user's head at other instances. In some examples, it may be beneficial for the VR headset to be able to detect when a head-worn device (e.g., headset, eyeglasses, headphones, etc.) is being removed from the user's head, is being placed on the user's head, or both.

SUMMARY OF THE DISCLOSURE

This disclosure relates to an angular detection system included in a device such as headphones or a headset. The angular detection system can include a magnet and a plurality of sensors, one of which can be located on a rotating component and the other can be located on a stationary component. The magnet can generate a plurality of magnetic flux lines. The plurality of sensors can be located and spatially separated along the motion path of the magnet for detecting the magnetic flux densities. The strength of the magnetic flux lines sensed by a given sensor can be used to determine the location of the magnet along its motion path. The plurality of sensors can generate one or more signals, such as voltage signals, which can be indicative of the strength of the sensed magnetic field lines. Based on the strength of the magnetic flux lines, the location of the magnet, or both, the system can determine the angle of rotation of the device. The relationship between the voltage signal(s) and the angle of rotation may be determined by a polynomial function or a look-up table, which may be stored in memory.

DETAILED DESCRIPTION

Figure 1:
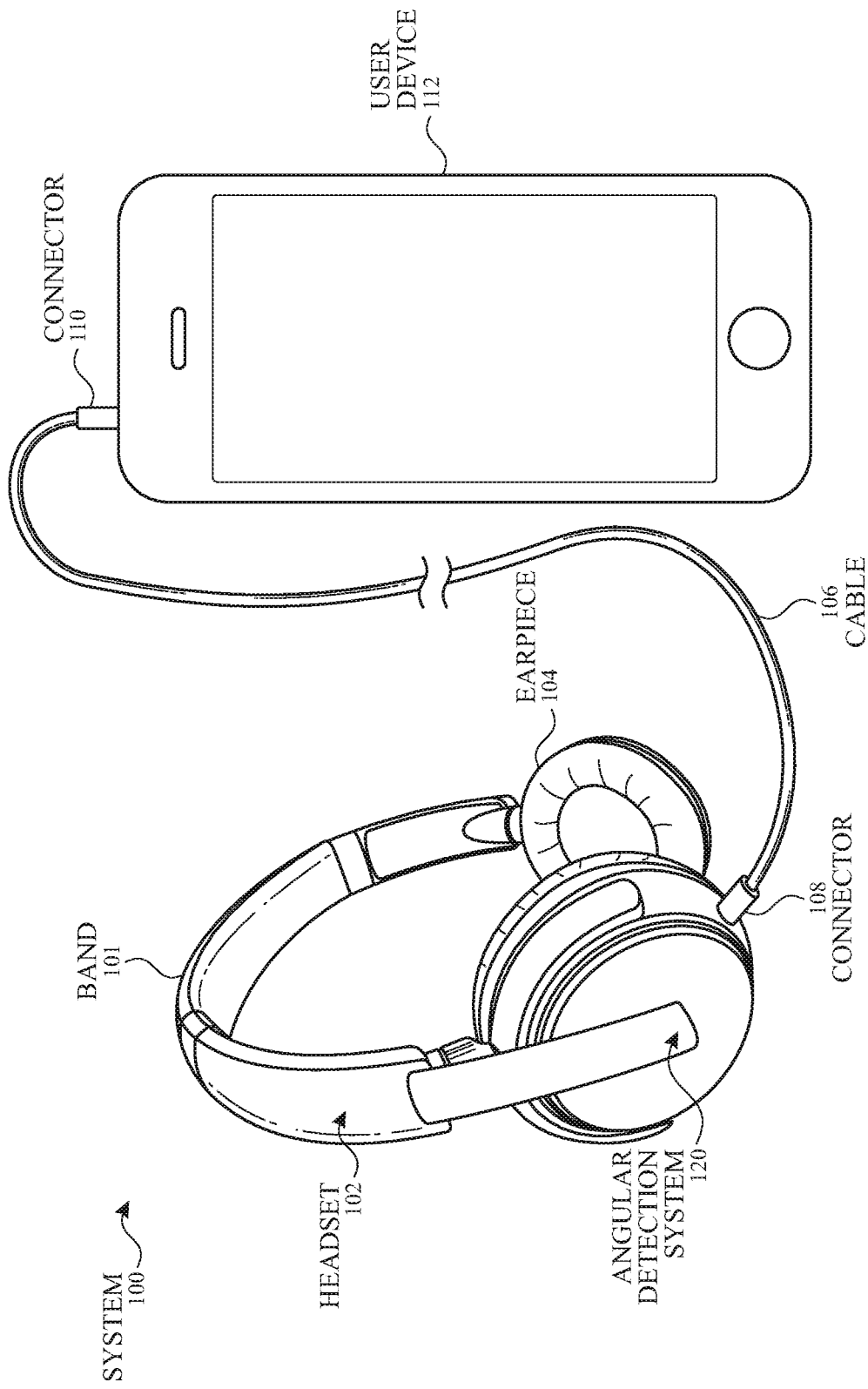
FIG. 1 illustrates an exemplary headphone or headset system according to examples of the disclosure.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one-step is described after the other step). Moreover, the illustration of a process by its depiction in a drawing does not imply that the illustrated process is exclusive of other variations and modification thereto, does not imply that the illustrated process or any of its steps are necessary to one or more of the examples, and does not imply that the illustrated process is preferred.

Virtual reality (VR) technology can be used for many applications such as military training, educational learning, and video games. VR technology can use one or more electronic devices to simulate a virtual environment and the user's physical presence in that virtual environment. One type of VR technology is augmented reality (AR) technology, where the user's real environment can be supplemented with computer-generated objects or content. Another type of VR technology is mixed reality (MR) technology, where the user's real environment and the virtual environment can be blended together.

VR/AR/MR technology can be simulated using one or more electronic devices. One electronic device can be a VR headset, where the user can use the VR headset to see the simulated virtual environment. As the user moves his or her head to look around, a display included in the headset can update to reflect the user's head movement. The VR headset can be worn on the user's head while the user is interacting with the VR system and can be removed from the user's head at other instances. In some examples, it may beneficial for the VR headset to be able to detect when a head-worn device (e.g., headset, eyeglasses, headphones, etc.) is being removed from the user's head, is being placed on the user's head, or both.

This disclosure relates to an angular detection system included in a device such as headphones or a headset. The angular detection system can include a magnet and a plurality of sensors, one of which can be located on a rotating component and the other can be located on a stationary component. The magnet can generate a plurality of magnetic flux lines. The plurality of sensors can be located and spatially separated along the motion path of the magnet for detecting the magnetic flux lines. The strength of the magnetic flux lines sensed by a given sensor can be used to determine the location of the magnet along its motion path. The plurality of sensors can generate one or more signals, such as voltage signals, which can be indicative of the strength of the sensed magnetic field lines. Based on the strength of the magnetic flux lines, the location of the magnet, or both, the system can determine the angle of rotation of the device. The relationship between the voltage signal(s) and the angle of rotation may be determined by a polynomial function or a look-up table, which may be stored in memory.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. In other instances, well-known process steps have been described in detail in order to avoid unnecessarily obscuring the described examples. Other applications are possible, such that the following examples should not be taken as limiting.

FIG. 1 illustrates an exemplary headphone or headset system according to examples of the disclosure. The system 100 includes a headset 102. The headset 102 can be configured to receive audio data and convert the audio data into sound. The headset 102 can be a variety of shapes and sizes, can be made from a variety of materials, and can include a variety of features. In some examples, the headset 102 can include, for example, a head-fitting band 101, such as one used for listening to the audio associated with music, a video, a gaming system, a VR system, or the like. The headset 102 can include earpieces 104, and the band 101 can connect the earpieces 104. The earpieces 104 can be an interface between the user's ear(s) and the headset 102. In some examples, the earpieces 104 can include one or several features configured to generate sound such as, e.g., one or several speakers. Examples of the disclosure can include a headphone that excludes a display.

In some examples, the system 100 can include a cable 106 that can, for example, include features that allow for simultaneously providing power, such as electricity, and audio data to the headset 102. The cable 106 can be a variety of shapes and sizes, a variety of cable types, and can be made from a variety of materials. The cable 106 can connect to the headset 102 via a connector 108. The connector 108 can be a variety of shapes and sizes and can be a variety of different connector types. In some examples, the connector 108 can receive power and/or audio data that can be used to control sound generated by the headset 102. In some examples, the connector 108 can include features for receiving power to charge the headset 102 and features for receiving audio data to control sound generated by the headset 102. In some examples, the connector 108 can be, e.g., a USB connector, a SATA connector, or any other desired connector.

The system 100 can also include one or more components to which the headset 102 communicates with. The one or more components can be, for example, a user device 112. The user device 112 can be a source of audio data, video data, or the like, where the data can control the operation of the headset 102 and/or the source of power for the headset 102. In some examples, the user device 112 can be an electronic device such as a portable electronic device. Exemplary electronic devices include, but are not limited to, a computer, a tablet, a cell phone, a television, a smart phone, a PDA, a radio, a gaming console, or any other electronic device usable to consume media.

In some examples, the user device 112 can connect to cable 106 via a connector 110. The connector 110 can be a variety of shapes and sizes and can be a variety of different connector types. In some examples, the connector 110 can transmit power and/or audio data that can be used to control sound generated by the headset 102. In some examples, the connector 110 can include features for transmitting power to power the headset 102 and/or for transmitting audio data to control sound generated by headset 102. In some examples, the connector 110 can be, e.g., a USB connector, a SATA connector, or any other desired connector. In some examples, the connector 110 can include a first portion that is located on the user device 112 such as, e.g., a connector receptacle or a connector insert, and a mating second portion that is located on the cable 106.

In some examples, the headset 102 may be configured for wireless communication of audio data, video data, or both. The headset 102 may include a transceiver, such as an antenna (not shown). The antenna can be located such that all or portions of the antenna are external to the headset 102. The antenna can be configured to receive information, such as, video data, from the user device 112. The user device 112 may also include a wireless transmitter (not shown), which can also include an antenna. The wireless communication between the headset 102 and the user device 112 can be performed according to any type of communication protocol or standard including, but not limited to, Bluetooth, WiFi (WLAN), NFC, or the like.

In some examples, the headset 102 can also include an angular detection system 120. The angular detection system 120 can be configured to detect an angle of rotation of a component, such as a cup, located in the headset 102. The angular detection system 120 can be configured to detect when the headset is being removed from the user's head, is being placed on the user's head, or both. That is, the angular detection system 120 can be configured to detect different states of the headset 102. The angular detection system 120 can be configured to generate one or more signals indicative of its state. The one or more signals can be transmitted to a controller (not shown). The controller can receive the one or more signals and can perform one or more actions in response to the signals. Exemplary actions can include, but are not limited to, turning one or more components (e.g., the entire headset 102, the entire system 100, etc.) on or off, determining the size of the user's head, etc. In some examples, the signal(s) can be transmitted via connector 108 and connector 110 to the user device 112. In other instances, the signal(s) can be transmitted via wireless communication, and the headset may not attach to the user device 112 via the cable 106, the connector 108, or the connector 110. Yet in other instances, the controller can be located in the headset 102, and can control one or more components for turning the headset on or off.

Overview of the Angular Detection System

Figure 2A:
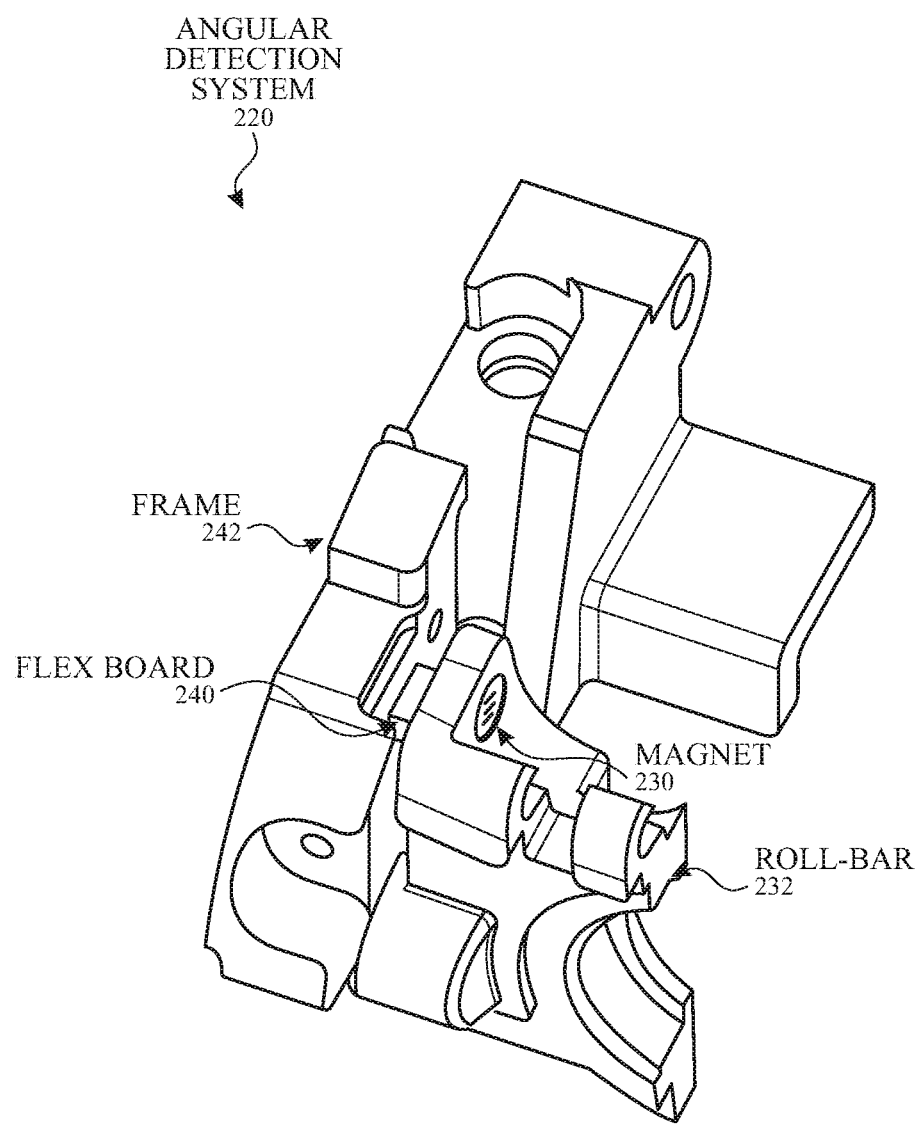
FIG. 2A illustrates a perspective view of an exemplary angular detection system according to examples of the disclosure.
Figure 2B:
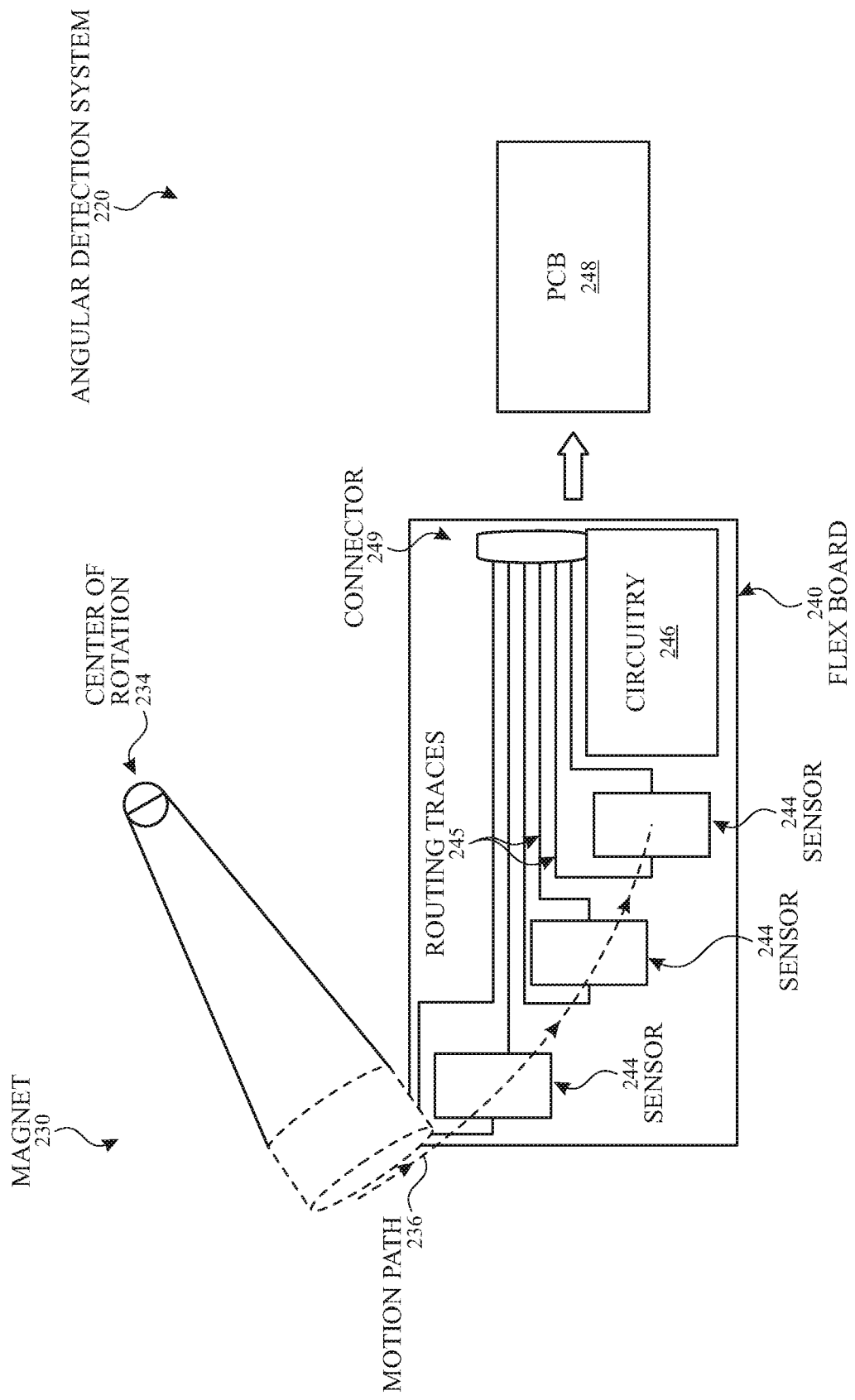
FIG. 2B illustrates a block diagram of an exemplary angular detection system according to examples of the disclosure.

FIG. 2A illustrates a perspective view, and FIG. 2B illustrates a block diagram of an exemplary angular detection system according to examples of the disclosure. The angular detection system 220 can include one or more components and/or one or more functions that are correspondingly similar to the angular detection system 120. The angular detection system 220 can include a magnet 230 and a flex board 240. The magnet 230 can be located (e.g., attached) on a rotating component such as a roll-bar 232, and the flex board 240 can be located (e.g., attached) on a stationary component such as a frame 242. In some instances, the frame 242 can be a portion of an entire frame of the headset. The stationary component can be a first component that does not move relative to a second component that may rotate. In some examples, the flex board 240 can be located on the roll-bar 232, and the magnet 230 can be located on the frame 242 (not shown).

The magnet 230 can be a permanent magnet that stores the magnetic energy at the time of manufacturing and is retained for a long (e.g., almost infinite) amount of time, for example. The magnet 230 can be attached to the roll-bar 232 and can have a center of rotation 234. The center of rotation 234 can be a fixed point where the magnet 230 moves along a certain motion path 236. In some examples, a screw (not explicitly labeled) can be located at the same location as the center of rotation 234. The screw can attach the roll-bar 232 to the frame 242 and can rotate as the roll-bar 232 rotates. As the screw rotates, the magnet 230 can move along the motion path 236. In some instances, the motion path 236 can be an arc. The movement of the roll-bar 232 may be limited to rotating along the motion path 236 of the magnet 230, in some examples.

The flex board 240 can include one or more components such as one or more sensors 244, circuitry 246, routing traces 245, and a connector 249. The one or more sensors 244 can be any type of magnetic-field sensor. Exemplary sensors include, but are not limited to, Hall effect sensors, anisotropic magnetoresistance (AMR) sensors, giant magnetoresistance (GMR) sensors, and tunnel magnetoresistance (TMR) sensors. The type of sensor 244 included in the flex board 240 can be based on one or more factors such as the power consumption of the sensors, signal-to-noise ratio, cost, size (e.g., footprint), and the like. In some examples, the sensors 244 can include at least two sensors of different types.

The sensors 244 can be located on the flex board 240 and can be placed along the motion path 236 of the magnet 230. In some examples, the sensors 244 may be placed within the sensing range of the motion path 236. The sensors 244 may be spaced apart with any separation distance between adjacent sensors. The separation distance(s) may be based on one or more factors such as the targeted dynamic range of angular detection, the number of sensors, the targeted sensing sensitivity for a given angle of rotation, and the like. The separation distance can refer to the arc length between the centers of adjacent sensors. In some instances, the system may include at least three sensors 244 with each pair of adjacent sensors having the same separation distance as other pairs. In other instances, the separation distances may differ. As one example, the system can include three sensors, where the first sensor can be placed at a reference point along the motion path (e.g., zero degrees), the second sensor can be placed at 10 degrees counter-clockwise from the reference point, and the third sensor can be placed at 20 degrees counter-clockwise from the reference point.

One or more routing traces 245 can be used to connect the sensors 244 to a power supply (not shown). The power supply can provide a current to the sensors 244 (discussed below). The routing traces 245 can also be used to route the signals generated by the sensors 244 (discussed below) to a controller, which can analyze the signals. The controller can be included in the circuitry 246 or can be located on a separate board, such as printed circuit board (PCB) 248. The flex board 240 can also include a connector 249 for connecting to the PCB 248.

Although the figure illustrates the system including a single magnet and three sensors, examples of the disclosure can include any number of magnets and any number of sensors. Additionally or alternatively, the location and orientation of the magnet and the sensors may differ from the exact configuration as shown in the figures.

Exemplary Operation of the Angular Detection System

Figure 3A:
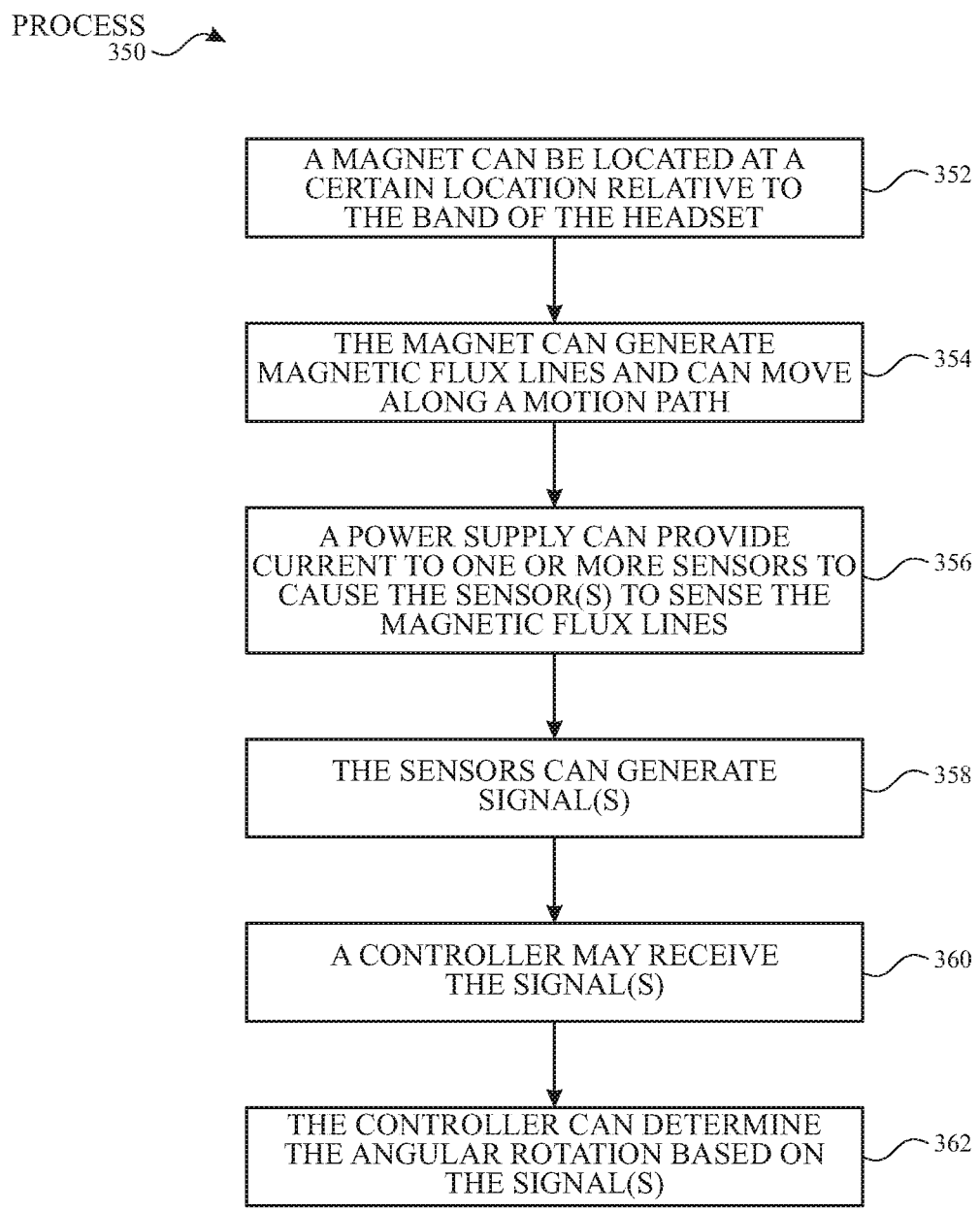
FIG. 3A illustrates an exemplary flow of operation of an angular detection system according to examples of the disclosure.
Figure 3B:
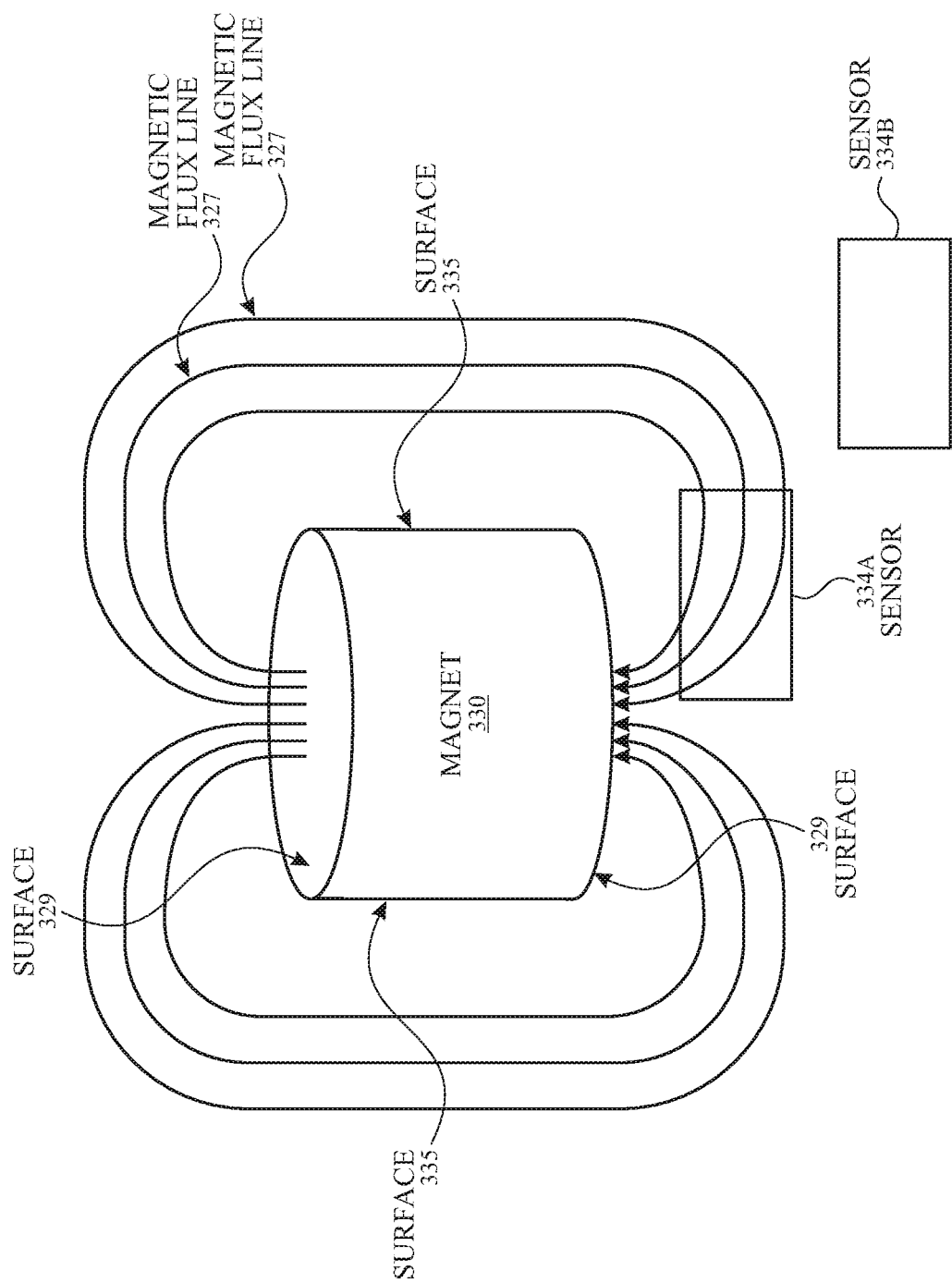
FIG. 3B illustrates an exemplary simplified block diagram according to examples of the disclosure.

FIG. 3A illustrates an exemplary flow of operation of the angular detection system, and FIG. 3B illustrates an exemplary simplified block diagram according to examples of the disclosure. A magnet 330 can be located at a certain location relative to the band (e.g., band 101 illustrated in FIG. 1) of the headset (e.g., headset 102 illustrated in FIG. 1) (step 352 of process 350). The magnet 330 can generate magnetic flux lines 327 that travel perpendicular to its surfaces 329. A given magnetic flux line 327 can travel a certain distance from the surfaces of the magnet 330. The strength of the magnetic field can be based on the spacing between the magnetic flux lines 327, so it may be greater near the top and bottom surfaces 329 of the magnet 330 than along the side surfaces 335.

The magnet 330 can be attached to a roll-bar (e.g., roll-bar 232 illustrated in FIG. 2A) and can move along a motion path (e.g., motion path 236 illustrated in FIG. 2B) by an amount related to the amount of rotation of the roll-bar (step 354 of process 350). The location of the magnet 330 along the motion path can be determined by the one or more signals generated by the one or more sensors 344, as discussed below. For example, the roll-bar may rotate in response to the user putting the headset on his or her head, which may cause the magnet 330 to change location.

The sensors 344 can be configured to sense the magnetic flux lines. The sensors 334 can be connected to a power supply 347. The power supply 347 can provide a current (e.g., a constant current) to the sensors 344, where the current can cause the sensors 344 to sense the magnetic flux lines (step 356 of process 350). The sensors 344 can generate one or more signals indicative of the strength of the magnetic flux lines it senses (step 358 of process 350). When a given sensor 344 is not located in the path of the magnetic flux lines, the sensor 344 may generate a signal (e.g., equal to zero or the noise level) that indicates that no magnetic flux lines are sensed. For example, sensor 334A may generate a non-zero signal due to being located in the path of the magnetic field lines, whereas sensor 334B may not.

A controller may receive the one or more signals (step 360 of process 350). The controller may determine from the signals where the magnet 330 is along its motion path based on the magnetic field strength (step 362 of process 350), as discussed in detail below. In some instances, the controller can determine the angle of rotation based on the signals, where the location along the motion path can be related to the angular motion, and the magnetic field strength information can be included in the signals.

The magnet 330 and the sensors 344 can include one or more components and/or one or more functions that are correspondingly similar to the magnet 240 and sensors 244, respectively.

Detection of the Angle of Rotation

Figure 4:
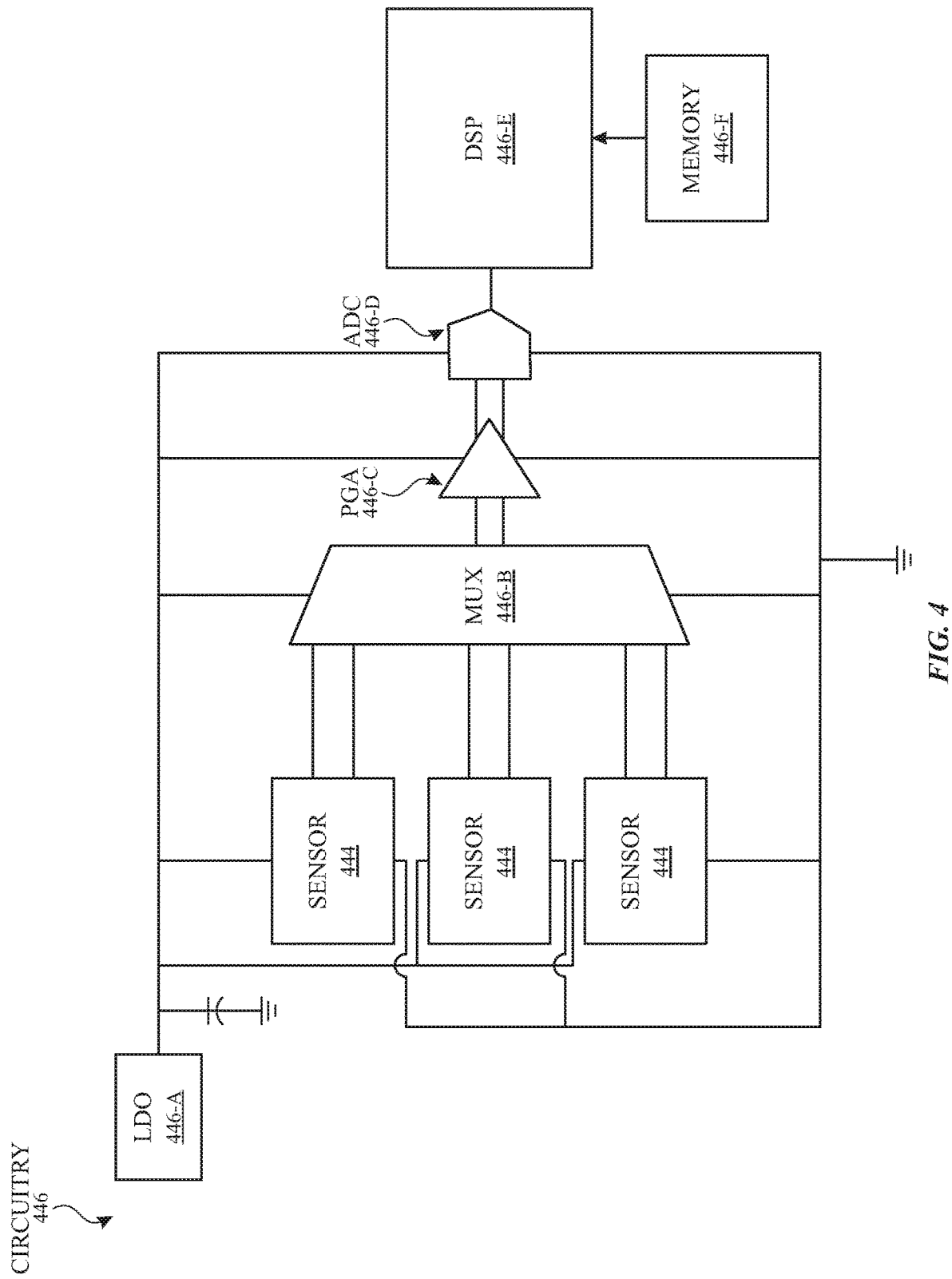
FIG. 4 illustrates a schematic diagram of exemplary circuitry for detecting the angle of rotation according to examples of the disclosure.

FIG. 4 illustrates a schematic diagram of exemplary circuitry for detecting the angle of rotation according to examples of the disclosure. Circuitry 446 can include a low-dropout voltage regulator (LDO) 446-A, a plurality of sensors 444, a multiplexer (MUX) 446-B, a programmable gain amplifier (PGA) 446-C, an analog-to-digital converter (ADC) 446-D, a digital signal processor (DSP) 446-E, and memory 446-F. Circuitry 446 and sensors 444 can include one or more components and/or one or more functions that are correspondingly similar to circuitry 246, sensors 244, and sensors 344, respectively.

The LDO 446-A can be a power supply configured to apply a voltage to the inputs of the plurality of sensors 444. The sensors 444 can sense the magnetic flux lines generated by the magnet and can generate voltage signals. The MUX 446-B can be configured to route the signals generated by the sensors 444 to the input of the PGA 446-C. The PGA 446-C can apply a gain factor to the signals, as discussed below. The output from PGA 446-C can be input into the ADC 446-D, which can convert the signals from the sensors 444 into digital form. The digital signals from the ADC 446-D can be input into the DSP 446-E.

The DSP 446-E can adjust the digital signals to account for system offset/gain mismatch. The DSP 446-E can also convert the digital signal, which may be a voltage signal, to a corresponding angle of rotation. The relationship between the voltage signal and the angle of rotation may be determined by a polynomial function or a look-up table, which may be stored in memory 446-F.

Scan Management

Figure 5A:
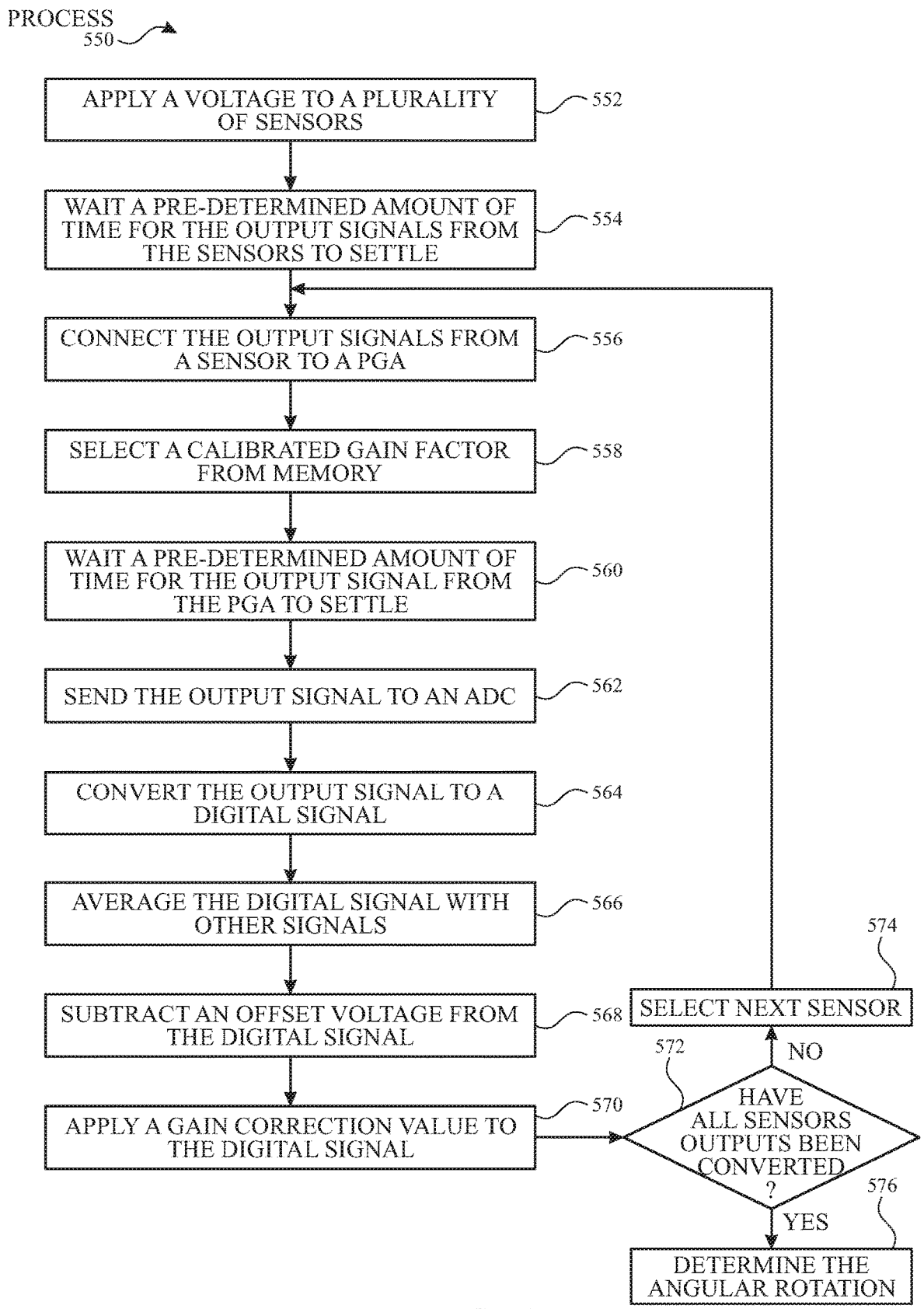
FIG. 5A illustrates a process flow for an exemplary scan management function according to examples of the disclosure.
Figure 5B:
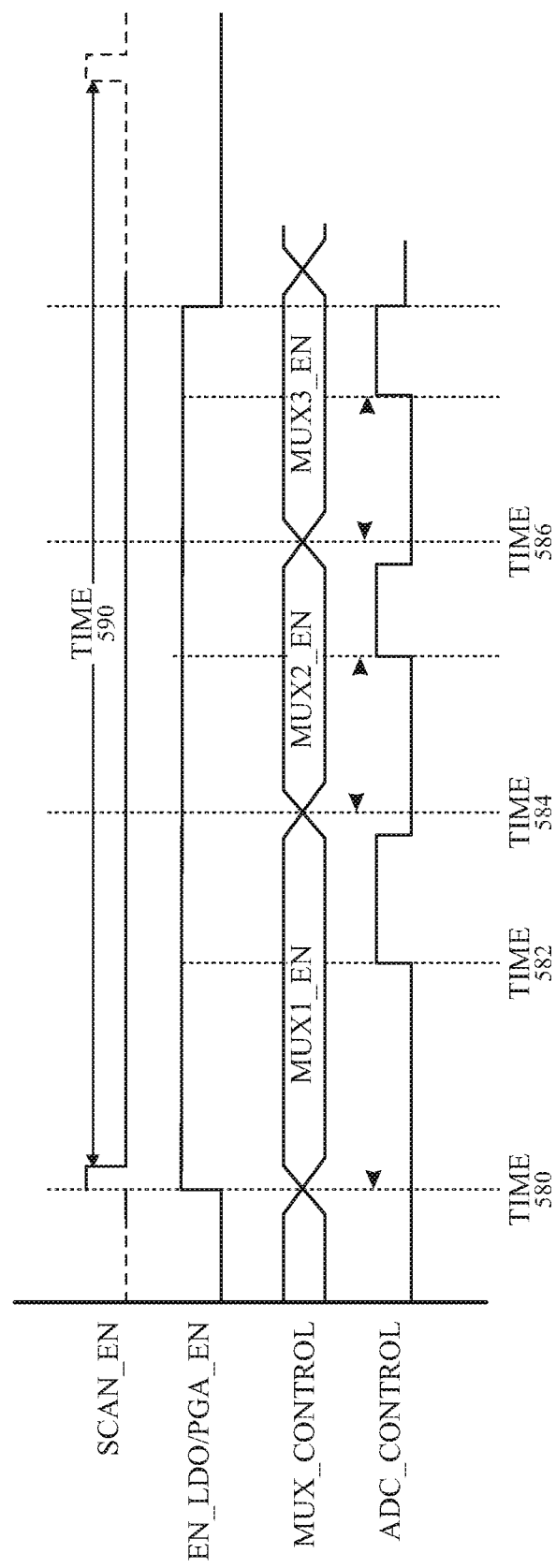
FIG. 5B illustrates a corresponding timing diagram according to examples of the disclosure.

The system can include a scan management function. FIG. 5A illustrates a process flow for an exemplary scan management function, and FIG. 5B illustrates a corresponding timing diagram, according to examples of the disclosure. The scan management function can be implemented using one or more components included in circuitry. The circuitry can be included in the flex board (e.g., flex board 240 illustrated in FIG. 2B) and/or another board, such as PCB 248 illustrated in FIG. 2B. For example, an external microcontroller or an ADC chip can implement the scan management function.

The scan management function can include a plurality of scans. A scan can last for a certain amount of time 590. In some instances, during a scan, a LDO (e.g., LDO 446-A illustrated in FIG. 4) can be configured to apply a voltage, such as a fixed voltage, to a plurality of sensors (e.g., sensors 444 illustrated in FIG. 4) (step 552 of process 550). The beginning of a scan can be indicated by SCAN_EN at time 580 as shown in FIG. 5B. The system can wait a pre-determined amount of time for the output signals from the sensors to settle (step 554 of process 550). A multiplexer (e.g., MUX 446-B illustrated in FIG. 4) can then connect the output signals from a first sensor to a PGA (e.g., PGA 446-C illustrated in FIG. 4) (step 556 of process 550). The connection from the first sensor can be indicated by the MUX_CONTROL signal being equal to MUX1_EN as shown in FIG. 5B. The system can select a calibrated gain factor from memory (e.g., memory 446-F illustrated in FIG. 4) (step 558 of process 550). The system can wait a pre-determined amount of time for the output signal from the PGA to settle (step 560 of process 550) and can send the output signal to an ADC (e.g., ADC 446-D illustrated in FIG. 4) once the wait time has elapsed (step 562 of process 550; time 582 in FIG. 5B). The ADC can be enabled as indicated by the signal ADC_CONTROL indicated in FIG. 5B. The ADC can convert the analog signal that it has received to a digital signal (step 564 of process 550). Optionally, the system may average the signal with one or more other signals (step 566 of process 550). Averaging the signals may reduce the impact of noise, such as quantization noise or high frequency noise.

In some examples, an offset voltage can be subtracted from the digital signal (step 568 of process 550). The offset voltage can be determined using an offset calibration procedure, which can determine the offset voltage introduced by each sensor. In some instances, the offset voltage for a given sensor may differ from that of other sensors. Exemplary offset voltages can include, but are not limited to, ±5 mV and +10 mV. In some examples, one or more offset voltages can be stored in memory (e.g., memory 446-F illustrated in FIG. 4).

The system may apply a gain correction value to convert the output signal from the sensors from units representative of magnetic flux to units representative of an electrical signal (step 570 of process 550). In some examples, one or more gain correction values can be stored in memory (e.g., memory 446-F illustrated in FIG. 4).

The system can then connect the output signals from the next sensor to the PGA (as indicated by signals MUX2_EN, MUX3_EN, etc. in FIG. 5B), as steps 556 to 570 can be repeated until all the sensor outputs are converted into digital signals (step 572 and step 574 of process 550). For example, a second sensor can be connected at time 584, and a third sensor can be connected at time 586, as shown in FIG. 5B. Once some (e.g., all) of the sensor outputs have been converted, the system can determine the angle of rotation (step 576 of process 550).

Figure 6:
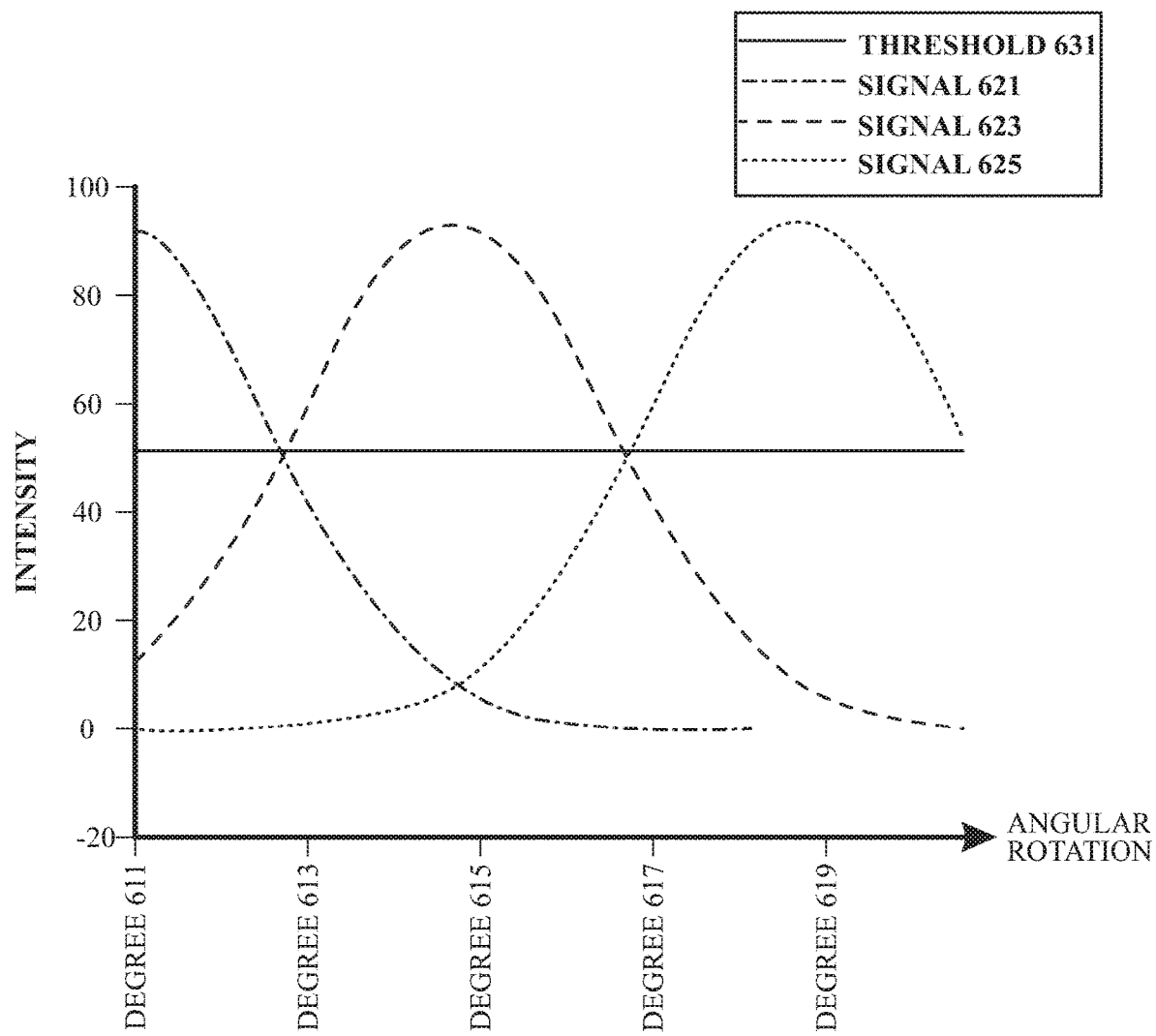
FIG. 6 illustrates exemplary output signals from the sensors as a function of angle of rotation according to examples in the disclosure.

FIG. 6 illustrates exemplary signals output from the sensors as a function of angle of rotation according to examples in the disclosure. As the roll-bar changes its angle of rotation, the intensity of the magnetic flux measured by a given sensor changes. For example, as shown in the figure, when the roll-bar is at degree 611 (e.g., zero degrees), the first sensor senses the maximum amount of magnetic flux (shown by signal 621), the second sensor senses a small amount (e.g., less than 20 mT) of magnetic flux (shown by signal 623), and the third sensor does not sense any magnetic flux (shown by signal 625). As the roll-bar changes its angle of rotation to degree 613 (e.g., five degrees), the magnetic flux sensed by the first sensor decreases. At the same time, the magnetic flux sensed by the second sensor increases, and there is no effect on the third sensor.

In some instances, the intensity of at least two (e.g., each) of the sensors may vary, and the magnet may be located closest to the sensor with the highest intensity relative to the other sensors. A given sensor can be associated with one or more unique angle of rotation values. The system can compare the intensity of the sensors and determine which sensor the magnet is closest to based on the comparison.

Based on the sensor that the magnet is closest to, the system can determine the angle of rotation of the device.

Then, as the roll-bar changes its angle of rotation to degree 615 (e.g., 10 degrees), the magnetic flux sensed by the first sensor decreases further to zero, indicating that magnetic field lines from the magnet attached to the roll-bar may be located outside of the sensing range of the first sensor. The magnetic flux sensed by the second sensor increases and reaches a maximum, which may indicate that the center of the second sensor and the magnet may be aligned. Additionally, the third sensor begins to sense the magnetic field lines.

Changing from the angle of rotation of the roll-bar from degree 615 to degree 617, the magnetic flux sensed by the second sensor decreases, the magnetic flux sensed by the third sensor increases, and the first sensor is unaffected. When the roll-bar reaches degree 619 (e.g., 20 degrees), only the third sensor senses the magnetic field lines.

By using multiple sensors, the dynamic range of the system can be increased. For example, a system having a single sensor can have a sensing range of 0-5 degrees, while a system having three sensors can have a sensing range of 0-20 degrees. In some examples, the signals from the different sensors can be readout individually. The magnitude of one or some (e.g., all) of the signals can be used to determine the angle of rotation of the roll-bar. Additionally or alternatively, the relative relationship between the signals can be used to determine the direction of rotation and/or the angle of rotation.

In some examples, a given sensor can be used (e.g., dedicated) for angular detection within a pre-assigned range. In some instances, the pre-assigned ranges for the sensors may not overlap with one another. For example, the first sensor can be used to detect a rotation of up to four degrees, the second sensor can be used to detect a rotation between four degrees to 14 degrees, and the third sensor can be used to detect a rotation between 14 degrees to 24 degrees.

In some instances, the system can be configured to determine the angle of rotation based on a threshold magnetic flux value. For example, the threshold magnetic flux value can be equal to threshold 631, which can be pre-determined. In some examples, the threshold 631 can be based on one or more factors such as electronic noise.

If the system determines that the signal 625 is greater than or equal to the threshold 631, then the system can determine that the angle of rotation falls within a certain range (e.g., is greater than or equal to 14 degrees) associated with the threshold. Additionally or alternatively, the system can determine the range of angle of rotation based on one or more relative differences between the signals. For example, if signal 621 and signal 623 are simultaneously lower than signal 623, the system can determine that the angle of rotation is greater than or equal to 14 degrees.

Figure 7:
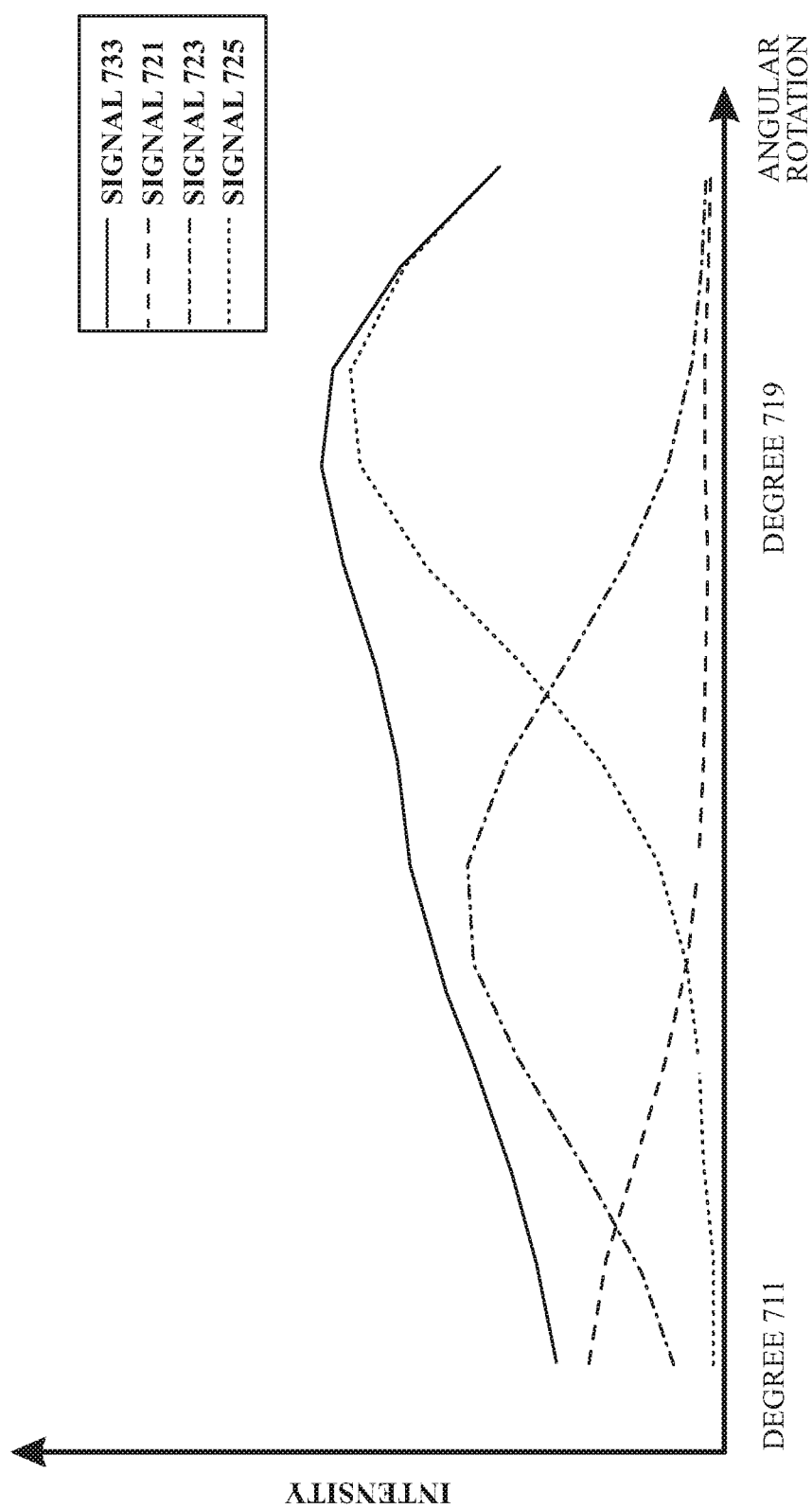
FIG. 7 illustrates an exemplary combined output voltage according to examples of the disclosure.

In some examples, the system can determine the angle of rotation based on a combined transfer function. FIG. 7 illustrates an exemplary combined output voltage according to examples of the disclosure. One or more gain values can be applied to the outputs from the sensors. The applied gain values can be such that the combined transfer curve has a monotonic response of magnetic flux over angle. For example, the signal 721 can be multiplied by one, the signal 723 can be multiplied by two, and the signal 725 can be multiplied by three. The combination of the signal 721, signal 723, and signal 725 can result in the signal 733. As shown in the figure, the monotonic response of signal 733 can be from degree 711 to degree 719.

In some examples, the applied gain values can be such that the combined transfer curve also has a certain slope. The pre-determined slope can depend on one or more factors such as the accuracy of the measurement, the electrical noise sources, etc. Exemplary electrical noise sources include, but are not limited to, quantization noise of the ADC, power supply noise observed by the sensor, and the thermal drift of the sensor.

Overview of the Components in an Exemplary Headset

Figure 8:
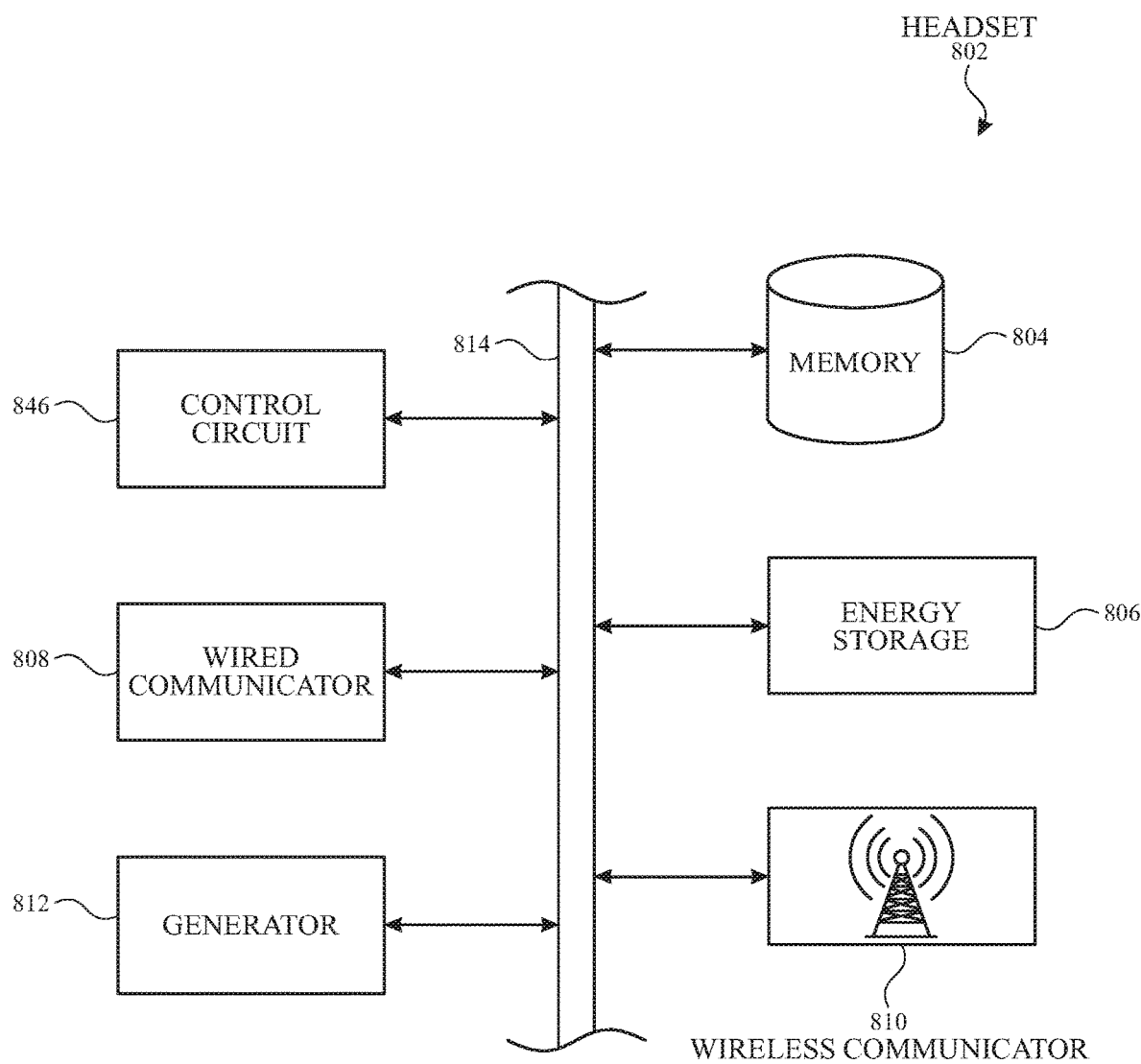
FIG. 8 illustrates a block diagram of the hardware and software components included in an exemplary headset according to examples of the disclosure.

FIG. 8 illustrates a block diagram of the hardware and software components included in an exemplary headset according to examples of the disclosure. Headset 802 can optionally include a control circuit 846, which can include a processor, for example. The processor can provide instructions to and can receive information from the other components of the headset 802. The processor can act according to stored instructions, where stored instructions can be located in memory, associated with the processor, and/or in other components of the headset 802. The processor can make decisions in accordance with the stored instructions.

In some examples, the stored instructions directing the operation of the processor may be implemented by hardware, software, scripting languages, firmware, middleware, microcode, hardware description languages, and/or a combination thereof. When implemented in software, firmware, middleware, scripting language, and/or microcode, the program code or code segments to perform the necessary tasks may be stored in a machine readable medium such as a storage medium. A code segment or machine-executable instruction may represent a procedure, a function, a subprogram, a program, a routine, a subroutine, a module, a software package, a script, a class, or any combination of instructions, data structures, and/or program statements. A code segment may be coupled to another code segment or a hardware circuit by passing and/or receiving information, data, arguments, parameters, data, etc. may be passed, forwarded, or transmitted via any suitable means including memory sharing, message passing, token passing, network transmission, etc.

The headset 802 can optionally include a memory 804. The memory 804 may represent one or more memories for storing data, including read only memory (ROM), random access memory (RAM), magnetic RAM, core memory, optical storage mediums, flash memory device, and/or other machine readable mediums for storing information. In some examples, the memory 804 may be implemented within the processor or external to the processor. In some examples, the memory 804 can be any type of long term, short term, volatile, nonvolatile, or other storage medium and is not to be limited to any particular type of memory or number of memories, or type of media upon which memory is stored. In some examples, memory 804 can include one or both volatile and nonvolatile memory, for example. In one specific example, the memory 804 can include a volatile portion such as RAM memory, and a nonvolatile portion such as flash memory.

The headset 802 can include a buffer, also referred to herein as a data buffer. The buffer can be configured to temporarily store data that is being received by the headset 802. In some examples, the buffer can be implemented in the memory 804, can be implemented in software stored in memory, or can be implemented in the control circuit 846. In some examples, the buffer can receive data, including audio data and/or video data from a wired communicator 808 and/or wireless communicator 810, and can provide this data to the control circuit 846.

The headset 802 can optionally include energy storage 806. The energy storage 806 can store energy such as, for example, electrical energy that can power the headset 802. The energy storage 806 can be any feature or combination of features capable of storing a desired amount of energy. In some examples, the energy storage 806 can be one or several batteries, rechargeable batteries, capacitors, or the like. The energy storage 806 can have any desired capacity. In some examples, the energy storage 806 can have a capacity so as to enable operation of the headset 802 using power from energy storage 806 for duration of at least 1 hour, 2 hours, 3 hours, 4 hours, 5 hours, 10 hours, 20 hours, 50 hours, or any other or intermediate length of time.

The headset 802 can optionally include the wired communicator 808. In some examples, the wired communicator 808 can include a connector and/or any other hardware or software component used in receiving power and/or data, including audio data, via the connector.

The headset 802 can optionally include a wireless communicator 810, which can be, for example, a wireless receiver. The wireless communicator 810 can, in some examples, include an antenna and software or hardware components used to control and/or operate the antenna. The wireless communicator 810 can receive data, which can include, for example, audio data from a user device and can provide this data to other components of the headset 802 including, for example, the control circuit 846.

The headset 802 can optionally include a generator 812. In some examples, the generator 812 can be configured to generate sound, video, or both. The generator 812 can include a speaker, a display, and the like.

In some examples, the components of the headset 802 can be in communication with and/or electrically connected via a circuit board 814. While depicted in the example of FIG. 8 as a circuit board 814, the components of the headset 802 can be connected via any desired features or components including, for example, one or several wires, one or several light guides, or the like.

An angular detection system is disclosed. The angular detection system can comprise: a stationary component; a rotating component, wherein the rotating component is capable of rotating relative to the stationary component; a magnet located on the rotating component, where the magnet generates a plurality of magnetic flux lines; a plurality of sensors located on the stationary component, where the plurality of sensors is placed along a motion path of the magnet, wherein the plurality of sensors is configured to sense the plurality of magnetic flux lines and generate one or more signals indicative of the sensed plurality of magnetic flux lines; and logic configured to determine an angle of rotation of the angular detection system based on the one or more signals. Additionally or alternatively, in some examples, the magnet is a permanent magnet. Additionally or alternatively, in some examples, the angular detection system further comprises: a screw for attaching the magnet to the rotating component, wherein the screw rotates as the rotating component rotates. Additionally or alternatively, in some examples, the rotating component is a roll-bar included in a headset. Additionally or alternatively, in some examples, the stationary component is a portion of a frame included in a headset. Additionally or alternatively, in some examples, the plurality of sensors includes one or more of Hall effect sensors, anisotropic magnetoresistance (AMR) sensors, giant magnetoresistance (GMR) sensors, and tunnel magnetoresistance (TMR) sensors. Additionally or alternatively, in some examples, the plurality of sensors includes at least two different types of sensors. Additionally or alternatively, in some examples, separation distances between pairs of adjacent sensors of the plurality of sensors are the same. Additionally or alternatively, in some examples, a first sensor of the plurality of sensors is located at a reference point along the motion path, a second sensor of the plurality of sensors is located 10 degrees counter-clockwise from the reference point, and a third sensor of the plurality of sensors is located 20 degrees counter-clockwise from the reference point. Additionally or alternatively, in some examples, the angular detection system further comprising: a flex board located on the stationary component, the flex board including: the plurality of sensors, and one or more routing traces that connect the plurality of sensors to a power supply. Additionally or alternatively, in some examples, the angular detection system is capable of sensing an angle of rotation of the system of up to 20 degrees. Additionally or alternatively, in some examples, each of the plurality of sensors is associated with a unique pre-assigned range.

A method for detecting an angle of rotation of a head-worn device is disclosed. The method can comprise: generating a plurality of magnetic flux lines from a magnet; rotating the magnet to a location along a motion path; sensing the plurality of magnetic flux lines using a plurality of sensors; for each of the plurality of sensors, generating a signal indicative of a strength of the sensed plurality of magnetic flux lines; and determining the angle of rotation based on the signals from the plurality of sensors. Additionally or alternatively, in some examples, the method further comprises: determining the location of the magnet by determining for at least one of the plurality of sensors that the at least one of the plurality of sensors is not located in a path of the plurality of magnetic flux lines when the respective signal is equal to zero. Additionally or alternatively, in some examples, the determination of the angle of rotation includes: comparing intensities of the signals of the plurality of sensors, associating the location of the magnet to one of the plurality of sensors based on the comparison, and determining the angle of rotation based on the association. Additionally or alternatively, in some examples, the determination of the angle of rotation includes: determining whether an intensity of at least one signal generated by at least one of the plurality of sensors is greater than or equal to a threshold value; and in accordance with the determination that the intensity is greater than or equal to the threshold value, determining that the angle of rotation is within a range associated with the threshold value. Additionally or alternatively, in some examples, the method further comprising: combining the signals generated by the plurality of sensors using a transfer function, wherein the determination of the angle of rotation is based on the combined signals.

A headset is disclosed. The headset may comprise: a frame; a roll-bar; an angular detection system including: a magnet located on one of the frame or roll-bar, where the magnet generates a plurality of magnetic flux lines; a plurality of sensors located on the other of the frame or the roll-bar, where the plurality of sensors is placed along a motion path of the magnet, wherein the plurality of sensors is configured to sense the plurality of magnetic flux lines and generate one or more signals indicative of the sensed plurality of magnetic flux lines; and logic configured to determine an angle of rotation of the angular detection system based on the one or more signals. Additionally or alternatively, in some examples, the headset is included in a virtual reality system. Additionally or alternatively, in some examples, the headset is headphones that exclude a display.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

The invention claimed is:

1. An angular detection system comprising:
   a stationary component;
   a rotating component, wherein the rotating component is capable of rotating relative to the stationary component;
   a magnet located on one of the stationary component or the rotating component, where the magnet generates a plurality of magnetic flux lines;
   a plurality of sensors located on the other of the stationary component and the rotating component, where the plurality of sensors is placed along a motion path of the magnet,
   wherein the plurality of sensors senses the plurality of magnetic flux lines and generates one or more signals indicative of the sensed plurality of magnetic flux lines; and
   logic that determines an angle of rotation of the angular detection system based on the one or more signals.

2. The angular detection system of claim 1, wherein the magnet is a permanent magnet.

3. The angular detection system of claim 1, further comprising:
   a screw for attaching the magnet to the rotating component, wherein the screw rotates as the rotating component rotates.

4. The angular detection system of claim 1, wherein the rotating component is a roll-bar included in a headset.

5. The angular detection system of claim 1, wherein the stationary component is a portion of a frame included in a headset.

6. The angular detection system of claim 1, wherein the plurality of sensors includes one or more of Hall effect sensors, anisotropic magnetoresistance (AMR) sensors, giant magnetoresistance (GMR) sensors, and tunnel magnetoresistance (TMR) sensors.

7. The angular detection system of claim 1, wherein the plurality of sensors include at least two different types of sensors.

8. The angular detection system of claim 1, wherein separation distances between pairs of adjacent sensors of the plurality of sensors are the same.

9. The angular detection system of claim 1, wherein a first sensor of the plurality of sensors is located at a reference point along the motion path, a second sensor of the plurality of sensors is located 10 degrees counter-clockwise from the reference point, and a third sensor of the plurality of sensors is located 20 degrees counter-clockwise from the reference point.

10. The angular detection system of claim 1, further comprising:
    a flex board located on the stationary component, the flex board including:
       the plurality of sensors, and
       one or more routing traces that connect the plurality of sensors to a power supply.

11. The angular detection system of claim 1, wherein the angular detection system is capable of sensing an angle of rotation of the system of 20 degrees.

12. The angular detection system of claim 1, wherein each of the plurality of sensors are associated with a unique pre-assigned range.

13. A method for detecting an angle of rotation of a head-worn device, the method comprising:
    generating a plurality of magnetic flux lines from a magnet;
    rotating the magnet to a location along a motion path;
    sensing the plurality of magnetic flux lines using a plurality of sensors;
    for each of the plurality of sensors, generating a signal indicative of a strength of the sensed plurality of magnetic flux lines; and
    determining the angle of rotation based on the signals from the plurality of sensors.

14. The method of claim 13, further comprising:
    determining the location of the magnet by determining for at least one of the plurality of sensors that the at least one of the plurality of sensors is not located in a path of the plurality of magnetic flux lines when the respective signal is equal to zero.

15. The method of claim 13, wherein the determination of the angle of rotation includes:
    comparing intensities of the signals of the plurality of sensors,
    associating the location of the magnet to one of the plurality of sensors based on the comparison, and
    determining the angle of rotation based on the association.

16. The method of claim 13, wherein the determination of the angle of rotation includes:
    determining whether an intensity of at least one signal generated by at least one of the plurality of sensors is greater than or equal to a threshold value; and
    in accordance with the determination that the intensity is greater than or equal to the threshold value, determining that the angle of rotation is within a range associated with the threshold value.

17. The method of claim 13, further comprising:
    combining the signals generated by the plurality of sensors using a transfer function, wherein the determination of the angle of rotation is based on the combined signals.

18. A headset comprising:
    a frame;
    a roll-bar;
    an angular detection system including:
       a magnet located on one of the frame or roll-bar, where the magnet generates a plurality of magnetic flux lines;
       a plurality of sensors located on the other of the frame or the roll-bar, where the plurality of sensors is placed along a motion path of the magnet,
       wherein the plurality of sensors senses the plurality of magnetic flux lines and generates one or more signals indicative of the sensed plurality of magnetic flux lines; and
    logic that determines an angle of rotation of the angular detection system based on the one or more signals.

19. The headset of claim 18, wherein the headset is included in a virtual reality system.

20. The headset of claim 18, wherein the headset is headphones that exclude a display.

* * * * *